US008726241B1

(12) United States Patent
Limondin et al.

(10) Patent No.: US 8,726,241 B1
(45) Date of Patent: May 13, 2014

(54) METHOD AND SYSTEM FOR THE DEVELOPMENT OF HIGH-ASSURANCE COMPUTING ELEMENTS

(75) Inventors: Philippe M. T. Limondin, Cedar Rapids, IA (US); T. Douglas Hiratzka, Coralville, IA (US); John J. Mettenburg, Cedar Rapids, IA (US); David F. Leskowicz, Marion, IA (US); Michael W. Whalen, Edina, MN (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 1711 days.

(21) Appl. No.: 11/810,571

(22) Filed: Jun. 6, 2007

(51) Int. Cl.
*G06F 9/44* (2006.01)

(52) U.S. Cl.
USPC .......................................................... 717/126

(58) Field of Classification Search
USPC ................................. 717/124, 135, 136, 126
See application file for complete search history.

(56) References Cited

U.S. PATENT DOCUMENTS

| | | | | |
|---|---|---|---|---|
| 5,604,895 | A | * | 2/1997 | Raimi .............................. 703/13 |
| 2004/0064806 | A1 | * | 4/2004 | Johnston-Watt et al. ..... 717/124 |
| 2005/0091025 | A1 | * | 4/2005 | Wilson et al. ................... 703/16 |
| 2005/0160321 | A1 | * | 7/2005 | Cleaveland et al. ............ 714/38 |
| 2008/0082968 | A1 | * | 4/2008 | Chang et al. .................. 717/128 |
| 2008/0109194 | A1 | * | 5/2008 | Gaudette ........................... 703/6 |
| 2008/0222583 | A1 | * | 9/2008 | Devins et al. ..................... 716/5 |
| 2009/0144043 | A1 | * | 6/2009 | McCain .......................... 703/14 |
| 2009/0177876 | A1 | * | 7/2009 | Wang et al. ....................... 713/1 |
| 2010/0023729 | A1 | * | 1/2010 | Jackson et al. ................. 712/36 |
| 2011/0131393 | A1 | * | 6/2011 | Ramchandran et al. ........ 712/37 |

OTHER PUBLICATIONS

Halbwachs et al. "The Synchronous Data Flow Programming Language LUSTRE", Proceedings of the IEEE, vol. 79, No. 9, Sep. 1991, pp. 1305-1319.*

* cited by examiner

*Primary Examiner* — Anna Deng
(74) *Attorney, Agent, or Firm* — Donna P. Suchy; Daniel M. Barbieri

(57) ABSTRACT

The present invention is a methodology for developing high-assurance computing elements. The method may comprise one or more of the following steps: (a) receiving a plurality of requirements detailing intended behavior of a high-assurance computing elements; (b) creating a model based on the requirements; (c) generating higher order language (HOL) code based on the model; (d) simulating the behavior of the computing elements from the HOL code; (e) generating test cases based on the model; (f) translating the model into a verification tool-specific format; and (g) formally verifying the model using a verification tool.

10 Claims, 1 Drawing Sheet

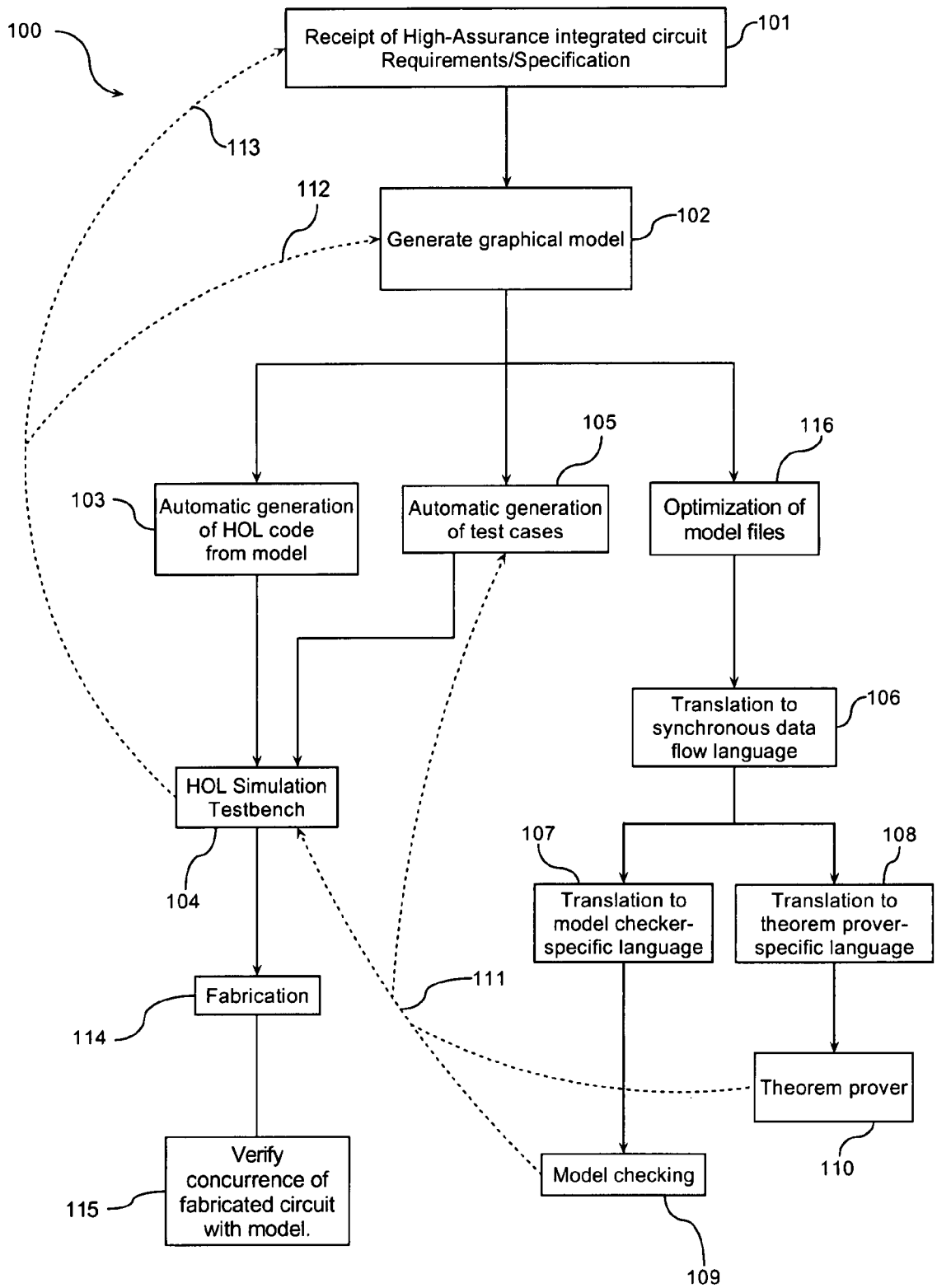

METHOD AND SYSTEM FOR THE DEVELOPMENT OF HIGH-ASSURANCE COMPUTING ELEMENTS

CROSS-REFERENCE TO RELATED APPLICATION

The present application is related to commonly assigned co-pending U.S. Patent Application disclosing a METHOD AND SYSTEM FOR THE DEVELOPMENT OF HIGH-ASSURANCE MICROCODE, filed Jun. 6, 2007 as Express Mail Label No. EM 005 737 870 US and incorporated herein by reference.

FIELD OF THE INVENTION

This invention relates to the field of integrated circuit design and, more specifically, efficient mechanisms for the design, simulation, verification and certification of high-assurance computing elements.

BACKGROUND OF THE INVENTION

The development of complex high-assurance hardware platforms for commercial and military control systems, such as avionics and communications, and secure computing applications such as crypto modernization, guard applications and Multiple Independent Levels of Security (MILS) separation has generated a need for an efficient development and certification path for such high-assurance computing elements. To date, traditional approaches to the development and verification of computational elements, such as microprocessors, have been labor intensive, error prone, and have lacked a formal specification for their implementation.

Design elements have been based on textual specifications and implemented with hand-coded hardware description languages (HDL) such as VHDL and Verilog. Verification has been performed through simulations which are driven by hand-generated test cases, corner case stimulus, or random input stimulus.

To develop and certify high-assurance devices, traditional approaches are inadequate due to the possibility of errors in specification interpretation, hand coding and incomplete test case coverage. In addition, the artifacts and proofs of correctness necessary for the rigorous nature of high-assurance certification are not inherent to the process and must be generated at the end of the design cycle.

As such, there is a need for efficient methods and systems for the design of high-assurance computing elements which integrate current model-based design principles with automatic code generation of higher order language (HOL) computer code and associated test cases, and automated analysis tools, such as model checkers and theorem provers. Such methods and systems provide designs having a documented pedigree of correctness.

SUMMARY OF THE INVENTION

Accordingly, the present invention is directed to a method for developing high-assurance computing elements.

In an embodiment of the invention, a method for developing high-assurance computing elements is disclosed. The method may comprise: (a) receiving a plurality of requirements detailing intended behavior of high-assurance computing elements; (b) creating a model based on the requirements; (c) generating higher order language (HOL) code based on the model; (d) simulating the behavior of the computing elements from the HOL code; (e) generating test cases based on the model; (f) translating the model into a verification tool-specific format; and (g) formally verifying the model using a verification tool.

In still a further embodiment of the invention, a computer-readable medium having computer readable instructions stored thereon for execution by a processor to perform a method, the method comprising the steps: (a) receiving a plurality of requirements detailing intended behavior of high-assurance computing elements; (b) creating a model based on the requirements; (c) generating HOL code based on the model; (d) simulating the behavior of the computing elements from the HOL code; (e) generating test cases based on the model; (f) translating the model into a verification tool-specific format; and (g) formally verifying the model using a verification tool.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figure in which:

FIG. 1 depicts a flow diagram detailing a method for developing high-assurance computing elements.

DETAILED DESCRIPTION OF THE INVENTION

The following discussion is presented to enable a person skilled in the art to make and use the present teachings. Various modifications to the illustrated embodiments will be readily apparent to those skilled in the art, and the generic principles herein may be applied to other embodiments and applications without departing from the present teachings. Thus, the present teachings are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of the present teachings. Skilled artisans will recognize the examples provided herein have many useful alternatives and fall within the scope of the present teachings. Reference will now be made, in detail, to presently preferred embodiments of the invention.

Referring to FIG. 1, a flow diagram detailing a method for developing high-assurance computing elements 100 is presented.

A text-based requirements/specification document detailing the specific feature set and functionality of high-assurance computing elements is received at step 101. A requirement is a singular documented need of what a particular product or service should be or do and are commonly used in systems engineering or software engineering. The requirements phase may be broken down into requirements elicitation (gathering the requirements from stakeholders), analysis (checking for consistency and completeness), definition (writing down descriptive requirements for developers), and incorporation of multiple requirements into a specification (creating an initial bridge between requirements and design).

A graphical modeling tool may be utilized to model the integrated circuit components of high-assurance computing elements in accordance with the requirements and specifications at step 102. For example, systems can be modeled by using the commercially available program SIMULINK®, developed by THE MATHWORKS™, to model the system. The SIMULINK® program, which runs in conjunction with the mathematical analysis tool MATLAB®, also developed by THE MATHWORKS™, can be used to model and develop control systems, signal processing systems and the like. The SIMULINK® program also offers simulation and prototyping capabilities. Models for simulating and analyzing real-world dynamic systems may be developed using the SIMULINK® program's block diagram interface. In the SIMULINK® program's block diagram interface, various blocks are used to represent input data, output data, functions that act on the data and the like. Additionally, specialized blocks and/or other tooling for specific applications can be developed or purchased from third party vendors. Such models may also be supplemented by further incorporating event-based, logical behavior modeling tools (such as the STATEFLOW® program developed by THE MATHWORKS™) with the algorithmic behavior modeling tools, such as SIMULINK®.

Once a model is developed using the graphical modeling program, other implementation steps may be taken to translate the model into a simulatable and synthesizable format. Various mechanisms may be used to automatically generate higher order language (HOL) computer code from the graphical model at step 103. Such programs include the REAL-TIME WORKSHOP® program or the REAL-TIME WORKSHOP® EMBEDDED CODER program and the SIMULINK® HDL CODER program, both produced by THE MATHWORKS™, among others. The REAL-TIME WORKSHOP® and SIMULINK® HDL CODER programs examine the model and determine, in similar fashions, what computer code needs to be generated to convert the model into a software or hardware-defined design based on the different functional blocks and interconnects as specified by the model. Each specific generator program then generates the HOL computer code corresponding to those blocks and interconnects. The HOL code may be ANSI compatible C code (via REAL-TIME WORKSHOP®), or VHDL or Verilog (via SIMULINK® HDL CODER) although computer code in any other programming language, such as Pascal, Cobol, Fortran, ADA, and the like, can also be generated, depending on the capability of the code generator program and the needs of the user.

Automatic code generation from the graphical model leads to a reduction in coding errors and the reduction in development cycle time. In addition, any changes in the requirements or specification can be implemented in the model and the corresponding code regenerated with little additional effort. Such an iterative development mechanism provides for additional time and cost savings. Further, long-term high-assurance benefits arise from the reuse of previously certified models (and the associated generated code) and the corresponding reduction in verification due to the certifiable behavioral characteristics of those models.

Additionally, formal verification of the graphical model may also be conducted as a parallel process with the implementation of the high-assurance computing elements. In the context of hardware and software systems, formal verification is the act of proving or disproving the correctness of intended algorithms underlying a system with respect to a certain formal specification or property, using formal mathematical methods. Such methods differ from current hardware verification methods which are merely directed at maximizing test-case coverage of the state space.

The graphical model of the high-assurance computing elements generated at step 102 may provide the input to an automatic test-case generation mechanism, such as the REACTIS® line of products developed by Reactive Systems at step 105. REACTIS® employs a two-pronged approach including test-generation and test-validation.

The test-generation component of REACTIS® relies on model coverage criteria to construct tests. The coverage criteria include generic concepts such as decision, condition, and modified condition/decision coverage (MC/DC); SIMULINK®-specific metrics such as branch and subsystem; and/or STATEFLOW®-specific metrics such as state, condition-action and transition-action. The model-validation component of REACTIS® uses a "test and check" approach for verifying models. Users first supplement their models with checks that monitor whether model behavior is consistent with expectations. The model-validation component then uses the test-cases created by the test-generation component to determine if any of the user-defined checks can be violated. These tests can then be used to diagnose the cause of any abnormal behavior that is detected.

The HOL code previously generated at step 103 and the test case vectors generated at step 105 may be input into an HOL simulation tool 104 to allow for the observation of the behavior of the modeled computing elements. Such simulation tools include the SIMILI products developed by SymphonyEDA or MODELSIM® developed by MENTOR GRAPHICS®. Simulation provides a mechanism for determining whether the present implementation of the high-assurance computing elements effectively achieves the requirements set forth in the specification. As the automatically generated test cases ensure extensive coverage of the state space, the simulation step will reveal most, but not all defects in the computing elements.

However, the present invention provides further assurances that all defects will be accounted for by incorporating formal mathematical methods to further verify the computing elements.

The graphical model may be further verified by translating the graphical model into a verifiable, formalized synchronous data flow programming language, such as LUSTRE at step 106. Such data flow languages have several merits. They have relatively simple syntax and semantics and provide completely functional models without side effects. These features make such languages well-suited to formal verification and subsequent program transformation. It also facilitates reuse, as a side-effect free module which will behave the same way in any context into which it is embedded. Also, synchronous data flow languages are naturally parallel in nature, in which the only constraints on parallelism are enforced by the data-dependencies between variables. This allows for parallel implementations to be realized, either in software, or directly in hardware.

These advantages also make such synchronous data flow languages a convenient source language for any subsequent transformations. They are highly conducive to re-translation into other languages thereby providing an effective intermediate representation when multiple subsequent transformations are contemplated.

Specifically, the LUSTRE language is based on sequences (possibly infinite in length) of values (e.g. sequence S having values $s_0, s_1, s_2, S_3 \ldots s_n$) of a given type where each of the values in the sequence is individually associated with a given arbitrary time-increment of a sequential clock value. A more detailed description of the LUSTRE language may be found in *The Synchronous Data Flow Programming Language LUSTRE*, Halbwacks et. al, *Proceedings of the IEEE*, Vol. 79, No. 9, September 1991, incorporated herein by reference.

The translation of the graphical model into a synchronous program at step 106 can be viewed, simply, as the generation of a set of input variables and assignment equations of the form $\{x_0=E_0, x_1=E_1, \ldots, x_n=En\}$ that must be acyclic in terms of data dependencies. This translation from the graphical model to a synchronous program may account for one or more of the following factors: lexical attributes, types, constants, variables and equations, and specific to LUSTRE, the handling of flows, clocks, nodes and expressions. There is an immediate correspondence between SIMULINK® primitive blocks and LUSTRE equations, and a similar correspondence between SIMULINK® subsystems and LUSTRE nodes, allowing a straightforward translation from the discrete subset of SIMULINK® objects into LUSTRE.

The translation of state machine graphical models, such as STATEFLOW®, into a synchronous program at step 106 involves creating state variables representing the states, junctions, variables, events, and functions in a synchronous program. The translation encodes the transitions and actions in the state machine as equations that update the state variables. Because state machines closely correspond to an imperative language, they are strictly more computationally powerful than synchronous languages, and so it is only possible to translate models that meet certain syntactic restrictions. A sufficient restriction is that there are no broadcast events and that there are no cycles in the directed event/state graph; i.e., if state X can broadcast an event to state Y, then state Y cannot broadcast an event to state X. A more detailed description of this translation process can be found in "*Defining and Translating a 'Safe' Subset of SIMULINK®/STATEFLOW® into LUSTRE*", N. Scaife et. al, *4th ACM International Conference on Embedded Software (EMSOFT'04)*, Pisa, Italy, September 2004.

Additionally, an intermediate translation step may be incorporated into the inventive method so as to simplify further subsequent translations. The model files generated at step 102 (e.g. .mdl-type files generated by the SIMULINK® program) will also necessarily include graphical elements corresponding to the user interface portion of the model. Such elements are not required for the formal mathematical certification methods of the present invention and the presence of such elements impedes the parsing of such files into synchronous data flow languages. In order to further optimize 116 the process, it may be desirable to remove such superfluous graphical elements from the model files prior to translation into a synchronous data flow language. For example, the REACTIS® program referenced above regarding automatic test case generation may also be used to provide a desirable intermediate representation of the model which does not include such graphical elements. Further, various other application programming interfaces (API) may be provided as add-ons to the modeling mechanism 102 (e.g. a SIMULINK® API) which provide specifically optimized model representations for use by other platforms. Such APIs may be incorporated without departing from the scope of the invention.

The mathematically verifiable representation embodied in the synchronous program may be translated into a verification tool-specific format at steps 107 or 108. As previously discussed, synchronous programming languages such as LUSTRE provide an effective intermediate representation when multiple subsequent transformations are to be carried out on the synchronous code, as in the case of the present invention.

Possible verification tools which may be incorporated into the present invention include, but are not limited too, model checkers, such as the PROVER® line of products (developed by Prover Technology) or the open-source NuSMV2 (developed as a joint project between L'Istituto Trentino di Cultura, II centro per la Ricerca Scientifica e Tecnologica [ITC-IRST] in Trento, Italy, Carnegie Mellon University, the University of Genoa and the University of Trento), or theorem provers, such as ACL2 (developed by Kaufmann and Moore of the University of Texas).

Such verification tools require differing input formats. For example, the ACL2 theorem prover is a Lisp-based computer program that can take Lisp-based mathematical formulas as input and provides mathematical proofs thereof. Further documentation regarding the ACL2 theorem prover may be found in "*How to Prove Theorems Formally*", Matt Kauffman and J Strother Moore, http://www.cs.utexas.edu/users/moore/publications/how-to-prove-thms/main.pdf, incorporated herein by reference Alternatively, the NuSMV model checker is an SMV-based model checker which accepts SMV-based programs as input. Further documentation regarding the NuSMV model checker may be found in the "*NuSMV 2.4 Users Guide*", Roberto Cavada, Alessandro Cimatti, Charles Arthur Jochim, Gavin Keighren, Emanuele Olivetti, Marco Pistore, Marco Roveri and Andrei Tchaltsev, http://nusmv.irst.itc.it/NuSMV/userman/v24/nusmv.pdf.

Additionally, other supported back-end languages for various target verification tools may include, but are not limited to C, JAVA, PVS, Spy, Cryptol and SAL, among others.

Translation into a compatible verification tool-specific format may account for one or more of the following factors: lexical attributes, types (e.g. scalar, tuple, and composite assignment conversions), constants, variables and equations, initial-instant functionality, flows, clocks, nodes and expressions (e.g. if-then-else/case statements).

Prior to its input into either a model checker or theorem prover, the translation of the mathematically verifiable synchronous program representation of steps 107 and 108 may be optimized to account for the nature of the particular verification tool. For theorem provers, it is desirable to have a high level of traceability between the synchronous program representation and the graphical model. As such, extensive commenting may be provided within the synchronous program representations (and the resulting verification tool-specific translations). Also, simplifications such as the propagation of constant expressions may be preformed. In the case of model checkers, more extensive transformations may be required. Possible optimizations may include constant propagation, duplicate variable elimination, inlining, hierarchy flattening, program slicing or register minimization.

Following such optimizations, the translated synchronous program may be provided to a model checker at step 109 and/or a theorem prover at step 110 for formal verification.

The NuSMV model checker shown at step 109 is an SMV-based program that takes SMV-based programs as input. NuSMV allows for the representation of synchronous and asynchronous finite state systems, and for the analysis of specifications expressed in Computation Tree Logic (CTL) and Linear Temporal Logic (LTL), using binary decision diagram (BDD)-based and Boolean satisfiability (SAT)-based model checking techniques. Heuristics are available for achieving efficiency and partially controlling the state explosion. The interaction with the user can be carried on with a textual interface, as well as in batch mode.

During the verification step 109, the formal verification/model checking tools attempt to show an instance of a property (i.e. a relation, either logical (Boolean) or temporal) between one or more signals in the microcode design or the ability or non-ability to reach a specified state which demonstrates the existence of a contradiction. If a contradiction exists, the given property does not hold (i.e. the property is disproved). For example, a model checker may be provided a given property or state X which is to be strictly avoided. If there exists any path that will reach state X, the model checker will generate a counterexample to this property in which state X is reached. Reachability properties can be automatically generated for different levels of coverage.

The verification tools check the computing elements design and produce certain diagnostic information 111. In the case of model checkers, this diagnostic information may comprise a counter-example to indicate an existence of a contradiction. A counter-example is typically a test sequence of inputs that disproves a property.

As previously discussed and shown at step 110, the ACL2 theorem prover is a Lisp-based computer program that can take Lisp-based mathematical formulas as input and provides mathematical proofs thereof. It employs proof techniques such as rewriting, decision procedures, and mathematical induction, among others to automatically prove theorems in a first-order mathematical theory of recursively defined functions and inductively constructed objects, through the use of an arithmetic lemma library. As with the model checker above, the theorem prover may provide diagnostic information 111 which indicates the outcome of the theorem prover operations.

The diagnostic information 111 provided by verification steps 109 and 110 may be routed back to either the test-case generation step 105 or directly to the HOL simulation step 104 to observe the effect that a counter-example or other diagnostic information has on the current implementation of the computing elements embodied in the graphical model.

These observations may be analyzed so as to refine the underlying design to account for the diagnostic information 111. The required modifications based on the observational data 112 may be incorporated into the graphical model so as to correct the high-assurance computing elements design to correspond with the specification/requirements 101.

Alternately, the diagnostic information 111 may demonstrate a requirements deficiency where the underlying project parameters do not reflect the intended computing elements functionality. In such a case, the observed behavior of the high-assurance computing elements 113 in response to the diagnostic information 111 may be incorporated into the requirements/specification step 101 so as to correctly identify the desired functionality.

Through use of these iterative, high-assurance development methods of simulation and verification of the computing elements model, the absence of any additional counter examples or unrealized circuit paths may eventually be demonstrated. At that point, a high-assurance computing elements may be fabricated based on the underlying graphical model at step 114. A gate-level description of the computing elements (i.e. a netlist) may be developed from the model. The netlist may then be provided to an automatic place-and-route tool which creates a layout which optimizes the footprint of the computing elements. The computing elements are then fabricated 114 on a chip based on that layout. Finally, fabricated computing elements may be compared to the modeled design developed at step 102 so as to verify their concurrence at step 115.

The forgoing method and system will ensure the production of high-assurance computing elements having a documented pedigree of correctness as embodied in artifacts generated therein, specifically the mathematical proofs and associated certified simulation outputs.

It is believed that the present invention and many of its attendant advantages will be understood from the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for designing one or more computing elements, the method comprising steps:
   receiving one or more requirements detailing one or more intended behaviors of the one or more computing elements;
   creating a model of the one or more computing elements based on the requirements;
   generating higher order language (HOL) code based on the model;
   translating the model into a synchronous program;
   translating the synchronous program into a specific format of a verification tool;
   obtaining one or more test cases embodying at least one counter-example from the verification tool;
   simulating behaviors of the one or more computing elements from the HOL code using the one or more test cases embodying the at least one counter-example; and
   formally verifying a synchronous program translation into a specific format of a verification tool based on simulated behaviors of the one or more computing elements from the HOL code using the one or more test cases embodying the at least one counter-example.

2. The method of claim 1, further comprising the steps:
   providing the one or more test cases embodying the counter-example to the verification tool for a formal re-verification.

3. The method of claim 1, further comprising the step:
   fabricating the one or more computing elements based on a formally verified model.

4. The method of claim 1, wherein the creating the model of the one or more computing elements is carried out in a graphical design environment.

5. A non-transitory computer-readable medium having computer readable instructions stored thereon for execution by a processor to perform a method, the method comprising:
   receiving one or more requirements detailing one or more intended behaviors of one or more computing elements;
   creating a model of the one or more computing elements based on the requirements;
   generating higher order language (HOL) code based on the model;
   translating the model into a synchronous program;
   translating the synchronous program into a specific format of a verification tool;
   obtaining one or more test cases embodying at least one counter-example from the verification tool;
   simulating behaviors of the one or more computing elements from the HOL code using the one or more test cases embodying the at least one counter-example; and
   formally verifying a synchronous program translated into a specific format of a verification tool based on simulated behaviors of the one or more computing elements from the HOL code using the one or more test cases embodying the at least one counter-example.

6. The non-transitory computer-readable medium of claim 5, the method further comprising the step:
   fabricating the one or more computing elements based on a formally verified model.

7. The non-transitory computer-readable medium of claim 5, wherein the creating the model of the one or more computing elements is carried out in a graphical design environment.

8. A system for designing one or more computing elements comprising:
   means for receiving one or more requirements detailing one or more intended behaviors of the one or more computing elements;
   means for creating a model of the one or more computing elements based on the requirements;
   means for generating higher order language (HOL) code based on the model;
   means for translating the model into a synchronous program;
   means for translating the synchronous program into a specific format of a verification tool;
   means for obtaining one or more test cases embodying at least one counter-example from the verification tool;
   means for simulating behaviors of the one or more computing elements from the HOL code using the one or more test cases embodying the at least one counter-example; and
   means for formally verifying a synchronous program translated into a specific format of a verification tool based on simulated behaviors of the one or more computing elements from the HOL code using the one or more test cases embodying the at least one counter-example.

9. The system of claim 8, further comprising:
   means for fabricating the one or more computing elements based on a formally verified model.

10. The method of claim 1, wherein the specific format of the verification tool is selected from at least one of a Lisp-based format, a Symbolic Model Verifier (SMV)-based format, a C-based format, JAVA-based format, a Prototype Verification System (PVS)-based format, a Cryptol-based format, or Symbolic Analysis Laboratory (SAL)-based format.

\* \* \* \* \*